(12) United States Patent
Lim (10) Patent No.: US 11,165,182 B2
(45) Date of Patent: Nov. 2, 2021

(54) FUNCTIONAL CONTACTOR

(71) Applicant: AMOTECH CO., LTD., Incheon (KR)

(72) Inventor: Byung Guk Lim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 184 days.

(21) Appl. No.: 16/471,067

(22) PCT Filed: Dec. 19, 2017

(86) PCT No.: PCT/KR2017/014976
§ 371 (c)(1),
(2) Date: Jun. 19, 2019

(87) PCT Pub. No.: WO2018/117579
PCT Pub. Date: Jun. 28, 2018

(65) Prior Publication Data
US 2020/0021051 A1     Jan. 16, 2020

(30) Foreign Application Priority Data

Dec. 21, 2016 (KR) .......................... 10-2016-0175648
Dec. 21, 2016 (KR) .......................... 10-2016-0175649

(51) Int. Cl.
*H05K 9/00* (2006.01)
*H01R 13/24* (2006.01)
(Continued)

(52) U.S. Cl.
CPC .......... *H01R 13/2435* (2013.01); *H01L 49/02* (2013.01); *H01R 13/24* (2013.01);
(Continued)

(58) Field of Classification Search
CPC .. H05K 9/0067; H05K 9/0079; H05K 1/0259; H05K 9/00; H01R 13/24;
(Continued)

(56) References Cited

U.S. PATENT DOCUMENTS 6,300,579 B1 * 10/2001 Yumi ..................... H01R 12/57
174/267
2005/0263323 A1 * 12/2005 Chen ..................... H01Q 1/243
174/260
(Continued)

FOREIGN PATENT DOCUMENTS

KR    2007-0109332    11/2007
KR    10-1334237    11/2013
(Continued)

OTHER PUBLICATIONS

International Search Report and Written Opinion issued in Corresponding International Patent Application No. PCT/KR2017/014976, dated Apr. 13, 2018.

*Primary Examiner* — Danny Nguyen
(74) *Attorney, Agent, or Firm* — Norton Rose Fulbright US LLP (57) ABSTRACT

A functional contactor is provided. Provided according to an exemplary embodiment of the present invention is a functional contactor comprising: a conductor which has elasticity and comes into contact with a conductor of an electronic device; a functional element which is connected to the conductor having elasticity and has a first and a second electrode respectively disposed on at least a part of an upper and a lower surface thereof; and a solder through which a lower surface of the conductor having elasticity is coupled with the first electrode of the functional element. The first electrode includes a first part outwardly extending from the lower surface of the conductor having elasticity along one side surface of the conductor having elasticity, and the solder includes an exposure part formed between the first part and a partial lateral surface of the one side surface of the conductor having elasticity.

17 Claims, 10 Drawing Sheets

(51) Int. Cl.
*H01L 49/02* (2006.01)
*H05K 1/02* (2006.01)

(52) U.S. Cl.
CPC ......... *H05K 9/0067* (2013.01); *H05K 9/0079* (2013.01); *H01L 28/60* (2013.01); *H05K 1/0259* (2013.01); *H05K 9/00* (2013.01)

(58) Field of Classification Search
CPC ....... H01R 13/703; H01L 49/02; H01L 28/60; H01C 7/10; H01G 4/40
USPC .................................................. 361/212, 220
See application file for complete search history.

(56) References Cited

U.S. PATENT DOCUMENTS

2009/0179315 A1\* 7/2009 Jereza ..................... H01L 24/36
257/676
2019/0097363 A1\* 3/2019 Cho ....................... H05K 1/181

FOREIGN PATENT DOCUMENTS

| KR | 2015-0056030 | 5/2015 |
| KR | 10-1585604 | 1/2016 |
| KR | 2016-0093563 | 8/2016 |
| WO | WO 2015/030365 | 3/2015 |

\* cited by examiner

FUNCTIONAL CONTACTOR

CROSS-REFERENCE TO RELATED APPLICATIONS

This application is a national phase application under 35 U.S.C. § 371 of International Application No. PCT/KR2017/014976, filed Dec. 19, 2017, which claims priority to and the benefit of Korean Patent Applications No. 10-2016-0175648, filed Dec. 21, 2016, and No. 10-2016-0175649, filed Dec. 21, 2016. The contents of the referenced patent applications are incorporated into the present application by reference.

FIELD OF THE DISCLOSURE

The present invention relates to a contactor of an electronic device such as, for example, a smart phone or the like.

DESCRIPTION OF RELATED ART

In a portable electronic device employing a housing or case formed of a metal material, a conductive contactor (or a conductive gasket) is installed between an external housing and an embedded circuit substrate of the portable electronic device so as to alleviate impact, block electromagnetic waves, and the like.

In this case, since an electrical path is formed between the external housing and the embedded circuit substrate due to the conductive contactor, static electricity having a high voltage which is instantaneously generated may flow into the embedded circuit substrate through a conductor such as an external metal housing, and thus a circuit, such as an integrated circuit (IC) or the like, may be damaged due to the static electricity flowing in the embedded circuit substrate through the conductive contactor. Further, when the portable electronic device is charged, a leakage current generated by an alternating current (AC) power source flows to the external housing along a ground of a circuit such that a user is uncomfortable, and, in the worst case, the leakage current results in electric shock which may cause injury to the user.

A functional element for protecting the user from the static electricity or the leakage current is provided together with the conductive gasket or contactor for connecting the metal housing to a circuit substrate. When a conductor such as a metal case is employed, it is required for a functional contactor which has various functions not only for a simple electrical contact but also for protecting a user or a circuit in the portable electronic device or for smoothly transferring a communication signal.

Further, the functional contactor is configured such that a conductive elastic portion is stacked on an electrode of a functional element through soldering. In this case, since a larger amount of external impact acts on a long side of the conductive elastic portion, bonding strength between the conductive elastic portion and the functional element is reduced such that the conductive elastic portion is separated from the functional element and thus a great deal of product defects occur.

SUMMARY OF THE INVENTION

The present invention is directed to providing a functional contactor which is capable of enhancing bonding strength between a functional element and a conductor having elasticity at a long side of the conductor having elasticity by increasing a bonding area using solder.

Further, the present invention is directed to providing a functional contactor capable of increasing bonding strength between a functional element and a conductor having elasticity in a vertical direction by minimizing a portion receiving external impact in the vertical direction.

One aspect of the present invention provides a functional contactor including a conductor having elasticity and configured to come into contact with a conductor of an electronic device, a functional element connected to the conductor having elasticity and having a first electrode and a second electrode which are provided on at least a part of an upper surface and at least a part of a lower surface of the functional element, respectively, and a solder configured to bond a lower surface of the conductor having elasticity and the first electrode of the functional element. The first electrode may include a first portion extending outward from the lower surface of the conductor having elasticity along one side of the conductor having elasticity, and the solder may include an exposed portion formed between the first portion and a side surface of the one side of the conductor having elasticity.

The conductor having elasticity may include a lower surface having a long side and a short side, and the first portion may be formed along the long side.

A length of a short side of the first electrode may be greater than a length of the short side of the lower surface of the conductor having elasticity.

The lower surface and a portion of the side surface of the conductor may be plated by a metal, such as Sn.

The first electrode may include a second portion extending outward from the lower surface of the conductor having elasticity along the other side of the conductor having elasticity.

The first electrode and the second electrode may be provided on an entirety of the upper surface and an entirety of the lower surface of the functional element, respectively.

The conductor having elasticity may include a clip-shaped contact portion configured to come into contact with the conductor of the electronic device, a bent portion formed with a predetermined curvature so as to provide an elastic force, and a terminal configured to be in contact with the first electrode of the functional element.

The conductor having elasticity may further include a side wall extending perpendicularly from the one side of the conductor. The side wall may extend to at least a part of the other side at which the bent portion is not formed. A portion between the side wall and the terminal may extend with a predetermined curvature.

The bent portion may extend from the terminal. The bent portion may be spaced a predetermined distance from the terminal.

The functional element may have at least one function among an electric shock prevention function of blocking a leakage current of an external power source flowing from a ground of a circuit substrate of the electronic device, a communication signal transfer function of passing a communication signal flowed from a conductive case or the circuit substrate, and an electrostatic discharge (ESD) protection function of discharging and passing static electricity when the static electricity flows from the conductive case.

Another aspect of the present invention provides a functional contactor including a conductor having elasticity and configured to come into contact with a conductor of an electronic device, a functional element connected to the conductor having elasticity and having a first electrode and a second electrode which are provided on at least a part of an upper surface and at least a part of a lower surface of the functional element, respectively, and a solder configured to bond a lower surface of the conductor having elasticity and the first electrode of the functional element. The first electrode may include a first portion formed with a predetermined curvature along one side of the conductor having elasticity, a longitudinal end of the first portion may correspond to a corner of a lower surface of the conductor having elasticity, and the solder may include an exposed portion formed between the first portion and a side surface of the one side of the conductor having elasticity.

The longitudinal end of the first portion may be disposed on a line perpendicular to the corner of the lower surface of the conductor having elasticity.

In accordance with the present invention, an electrode of a functional element is formed in a large size at a long side of a conductor having elasticity such that bonding strength between the functional element and a conductor having elasticity can be enhanced at a long side of the conductor having elasticity. Consequently, reliability of a product can be improved.

In accordance with the present invention, an upper surface of the functional element is configured to be substantially identical to a lower surface of the conductor having elasticity, and a longitudinal end of the functional element is formed to have a predetermined curvature such that the functional element barely has a portion protruding outward from the conductor having elasticity. Consequently, a portion receiving external impact can be minimized in a vertical direction such that the bonding strength between the functional element and the conductor having elasticity can be enhanced.

DETAILED DESCRIPTION OF THE INVENTION

Hereinafter, embodiments of the present invention will be fully described in detail which is suitable for easy implementation by those skilled in the art to which the present invention pertains with reference to the accompanying drawings. The present invention may be implemented in various different forms, and thus it is not limited to the embodiments which will be described herein. In the drawings, some portions not related to the description will be omitted in order to clearly describe the present invention, and the same or similar reference numerals are given to the same or similar components throughout this disclosure.

Figure 1:
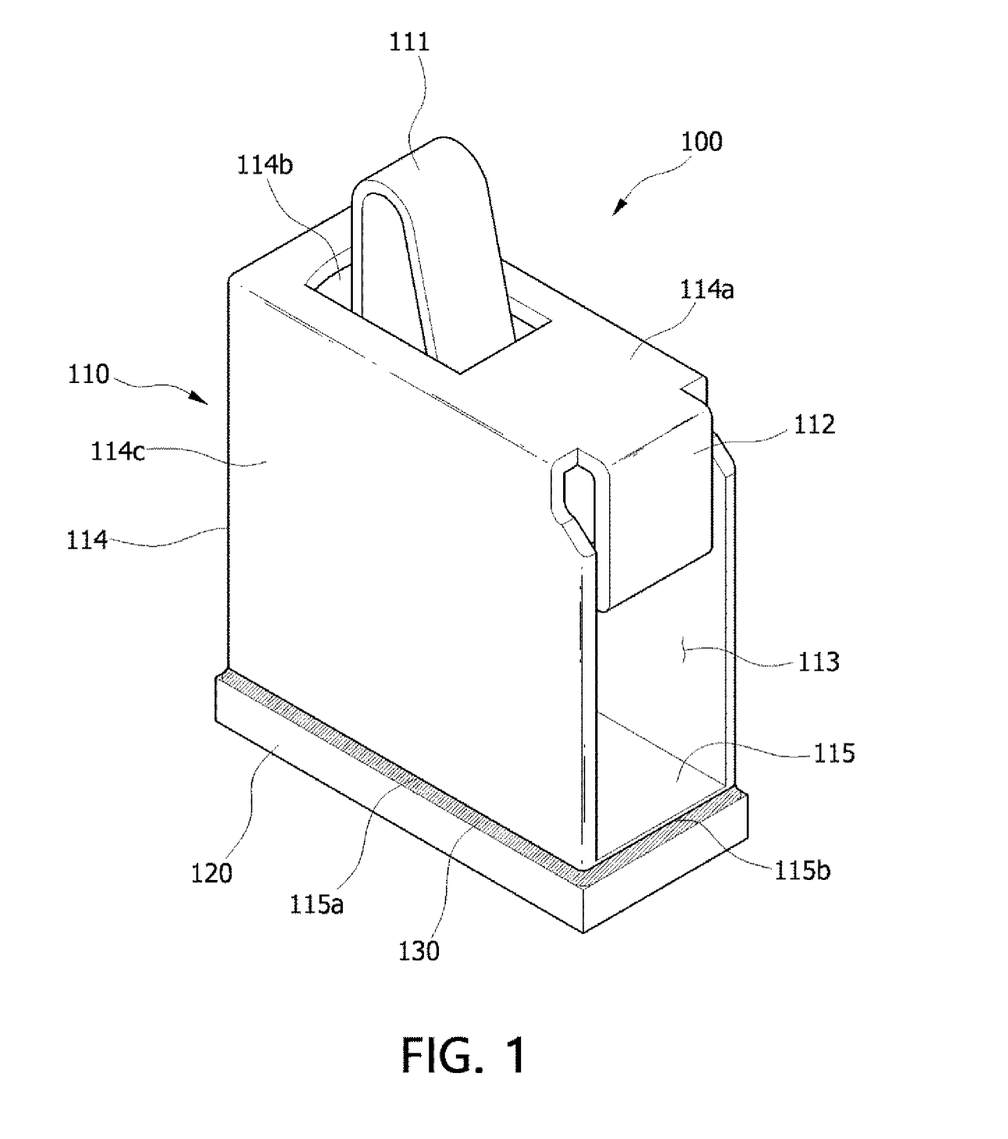
FIG. 1 is a perspective view illustrating a functional contactor according to a first embodiment of the present invention.
Figure 2:
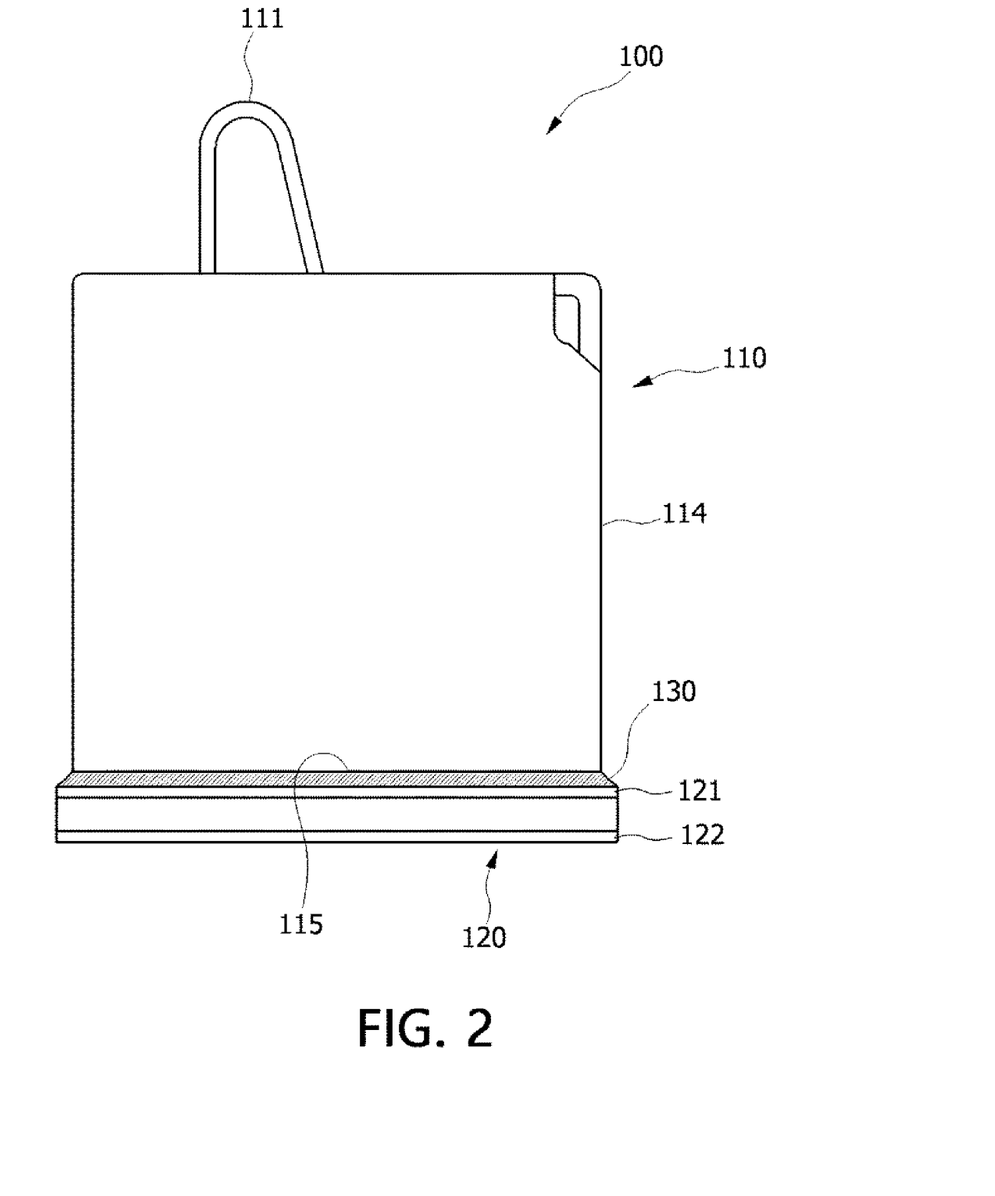
FIG. 2 is a side view of FIG. 1.
Figure 3:
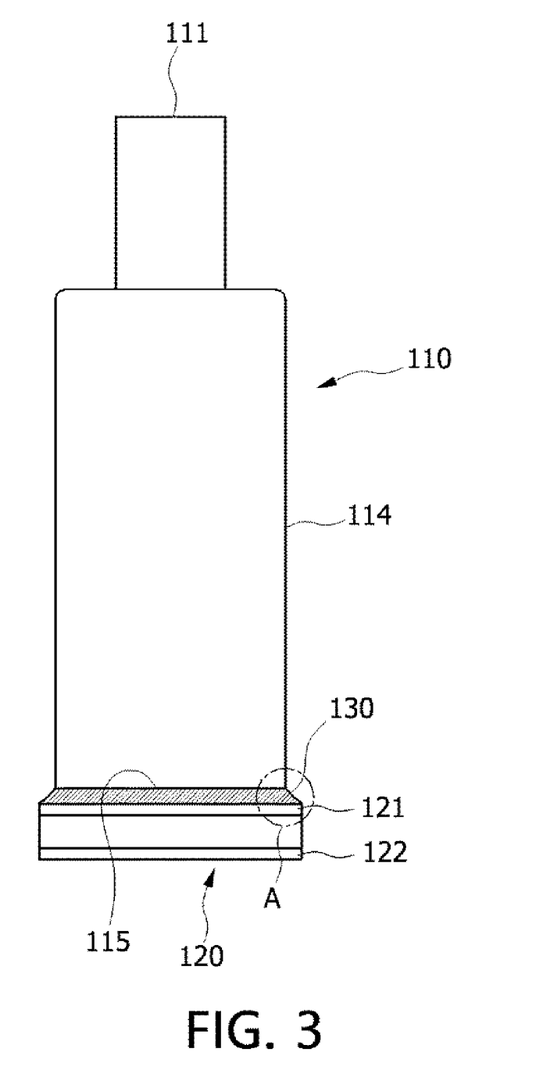
FIG. 3 is a front view of FIG. 1.

As shown in FIGS. 1 and 3, a functional contactor 100 according to a first embodiment of the present invention includes a conductor 110 having elasticity, a functional element 120, and a solder 130.

In a portable electronic device, the functional contactor 100 is configured to electrically connect a conductive case, such as an external metal case, to a circuit substrate or to electrically connect the conductive case to a conductive bracket electrically coupled to one side of the circuit substrate.

In this case, in the functional contactor 100, the conductor 110 having elasticity may come into contact with the circuit substrate or the conductive bracket, and the functional element 120 may be coupled to the conductive case. However, the conductor 110 having elasticity may come into contact with the conductive case, and the functional element 120 may be coupled to the circuit substrate.

For example, when the functional contactor 100 is a functional contactor of a surface mount technology (SMT) type, i.e., the functional contactor 100 is coupled through soldering, the functional element 120 may be bonded to the circuit substrate, and when the functional contactor 100 is a functional contactor of an adhesive layer type, i.e., the functional contactor 100 is coupled through a conductive adhesive layer, the functional element 120 may be coupled to the conductive case.

Meanwhile, the portable electronic device may be a portable terminal such as a smart phone, a cellular phone, or the like and may be a smart watch, a digital camera, a digital multimedia broadcasting (DMB) receiver, an electronic book, a netbook, a tablet personal computer (PC), or the like. The electronic device may have any suitable electronic components including antenna structures for communicating with external devices.

Here, the conductive case may serve as an antenna for communication between the portable electronic device and an external device. For example, the conductive case may be provided to partially or entirely surround a side portion of the portable electronic device.

The conductor 110 having elasticity comes into electrical contact with a conductor of the electronic device and has elasticity. For example, the conductor 110 having elasticity may come into electrical contact with any one among the circuit substrate of the electronic device, the bracket coupled to the circuit substrate, and a conductor, such as a case, contactable with a human body.

Here, when the conductor 110 having elasticity comes into contact with the conductor of the electronic device, the conductor 110 having elasticity may be contracted to the functional element 120 due to a pressing force, and when the conductor of the electronic device is separated from the conductor 110, the conductor 110 may be restored to its original state due to an elastic force.

Meanwhile, when the conductor 110 having elasticity is pressurized, galvanic corrosion occurs due to a potential difference between dissimilar metals. In this case, in order to minimize galvanic corrosion, the conductor 110 having elasticity may be formed to have a small contact area.

One side of the conductor 110 having elasticity comes into contact with the conductor of the electronic device, the other side thereof is electrically connected to the functional element 120, and a lower surface thereof is formed to have a long side 115a and a short side 115b. That is, the conductor 110 having elasticity may have a rectangular shape in which a length of one side of the lower surface is longer than a length of the other side thereof.

In the description of the present invention, although the conductor has been shown and described as including the lower surface having a long side and a short side, the present invention is not limited thereto, and the lower surface of the conductor may be formed in a square shape.

The functional element 120 is electrically connected in series to the conductor 110 having elasticity, and a first electrode 121 and a second electrode 122 are provided on at least a part of an upper surface and at least a part of a lower surface of the functional element 120, respectively.

For example, the first electrode 121 and the second electrode 122 may be provided on portions of the upper surface and the lower surface of the functional element 120, respectively. That is, in the functional element 120, a body between the first electrode 121 and the second electrode 122 may be formed to protrude outward further than the first electrode 121 and the second electrode 122.

As an alternative example, each of the first electrode 121 and the second electrode 122 may be formed to have a large area so as to increase a capacity of capacitance. That is, the first electrode 121 and the second electrode 122 may be formed on an entirety of the upper surface and an entirety of the lower surface of the functional element 120.

In this case, the conductor 110 having elasticity may be stacked on and coupled to the first electrode 121, and the second electrode 122 may be coupled to the circuit substrate through soldering or to a conductor, such as a conductive case, through a conductive adhesive layer.

The solder 130 is configured to connect and couple the conductor 110 having elasticity to the functional element 120. The solder 130 couples a lower surface of the conductor 110 having elasticity to the first electrode 121 of the functional element 120.

In a soldering process, after a solder paste is applied on the first electrode 121, the solder 130 is heated after the conductor 110 having elasticity is disposed on the solder paste such that the molten solder paste is fused to the lower surface of the conductor 110 having elasticity and the first electrode 121 of the functional element 120. Consequently, the conductor 110 having elasticity may be bonded to the functional element 120.

In this case, bonding strength between the elastic conductor 110 and the functional element 120 acts differently on the short side 115b having a short length and the long side 115a having a long length. That is, since external impact acts on the conductor 110 having elasticity at the long side 115a more than the short side 115b through a larger area, the bonding strength with respect to the long side 115a is smaller than that with respect to the short side 115b.

Consequently, the conductor 110 having elasticity is vulnerable to external impact on the long side 115a as compared with the short side 115b and thus a case in which the conductor 110 is separated from the functional element 120 occurs frequently such that correction for the separation is required.

To this end, in the functional contactor 100 of the present invention, the first electrode 121 of the functional element 120 extends outward from the lower surface of the conductor 110 having elasticity along the long side 115a thereof. That is, the first electrode 121 includes a first portion 121a formed to be longer than a terminal 115 of the conductor 110 having elasticity (see FIG. 4).

Figure 4:
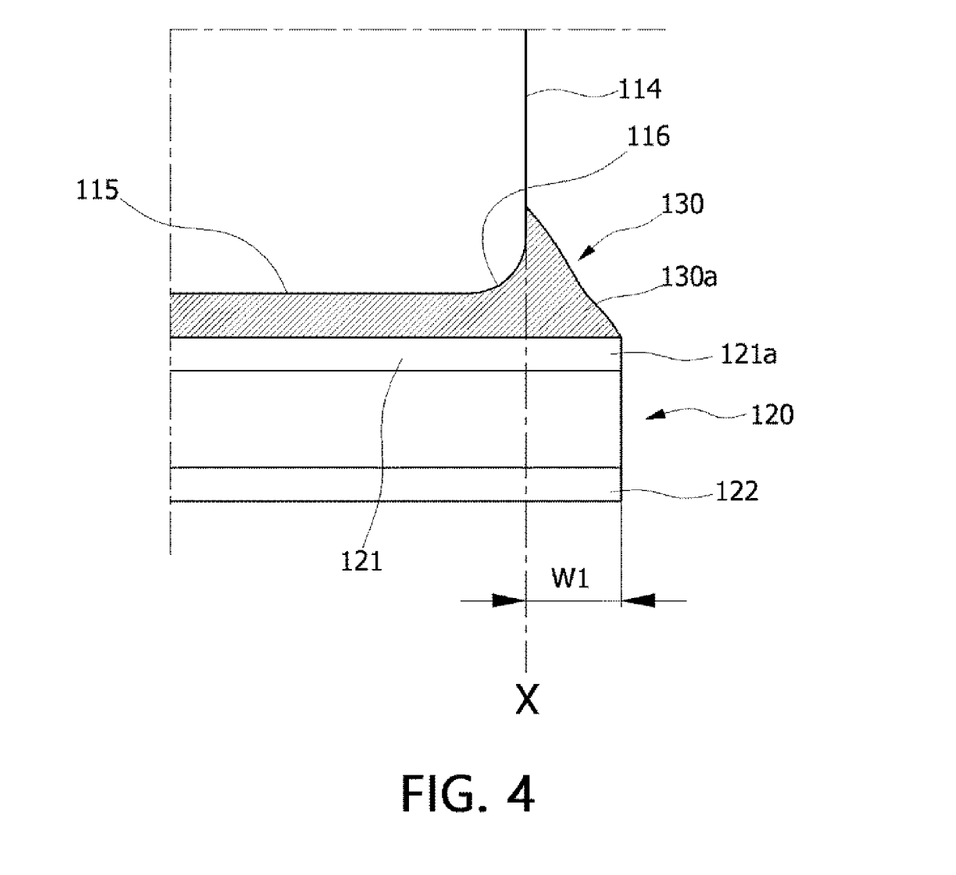
FIG. 4 is an enlarged view of a portion A of FIG. 3.

In this case, the solder 130 is formed between the first portion 121a and a portion of a side surface of the long side 115a of the conductor 110 having elasticity. That is, the solder 130 is mainly disposed between the conductor 110 having elasticity and the functional element 120. During soldering, the molten solder rises along the side surface of the conductor 110 having elasticity while flowing to the first portion 121a of the first electrode 121, thereby forming an exposed portion 130a which is exposed to the outside.

Consequently, since the formed area of the solder 130 connecting the conductor 110 having elasticity to the functional element 120 increases in size due to the exposed portion 130a formed between the first portion 121a of the first electrode 121 and a portion of the side surface of the conductor 110 having elasticity, bonding strength with respect to the long side 115a of the conductor 110 having elasticity may increase. Therefore, even when external impact is applied to the long side 115a, the conductor 110 having elasticity is prevented from being separated from the functional element 120 so that reliability of a product may be improved.

In this case, a plating process may be performed on the portion of the side surface of the conductor 110 so as to allow the molten solder to easily rise along the side surface of the elastic conductor 110.

That is, when the plating process is performed with a metal on the lower surface of the conductor 110 having elasticity so as to be easily soldered to the functional element 120, the plating process may be simultaneously performed on the portion of the side surface of the conductor 110 having elasticity. Here, the metal plated on the lower surface and the portion of the side surface of the conductor 110 having elasticity may be Sn.

Consequently, not only does the area of the solder 130 increase, but also the solder 130 is formed to have a predetermined thickness from the bonded portion between the conductor 110 having elasticity and the functional element 120 such that the bonding strength between the conductor 110 having elasticity and the functional element 120 may further be improved at the long side 115a.

In this case, a length of a short side of the first electrode 121 may be in a range of 1.01 to 1.2 times greater than a length of the lower surface of the conductor 110 having elasticity. That is, a ratio of the length of the lower surface of the conductor 110 having elasticity to the length of the short side of the first electrode 121 may be in a range of 1:1.01 to 1:1.2. In other words, a length W1 of the first portion 121a may be greater than the length of the short side of the lower surface of the conductor 110 having elasticity by 1 to 20% (see FIG. 4).

Here, when the length of the short side of the first electrode 121 is less than or equal to 1.01 times the length of the lower surface of the conductor 110, an area bonded due to the exposed portion 130a of the solder 130 is not sufficiently secured such that bonding strength sufficient to withstand external impact is not satisfied.

Further, when the length of the short side of the first electrode 121 is greater than or equal to 1.2 times the length of the lower surface of the conductor 110, a size of the functional element 120 increases without an increase effect of specific bonding strength such that miniaturization is adversely affected.

In addition, the conductor 110 having elasticity may further include a round portion 116 between an exterior portion 114 and the terminal 115. That is, the conductor 110 having elasticity may extend due to the round portion 116 having a predetermined curvature between an exterior portion 114 and the terminal 115 (see FIG. 4).

Consequently, since a corner portion of the conductor 110 having elasticity is formed inward, the solder 130 corresponding to an area of the round portion 116 may be further provided between the conductor 110 having elasticity and the functional element 120 such that the bonding strength between the conductor 110 having elasticity and the functional element 120 may be further enhanced.

In this case, the first electrode 121 of the functional element 120 may extend outward from the lower surface of the conductor 110 having elasticity along the long side 115a thereof. That is, the first electrode 121 may include a second portion formed to be longer than the terminal 115 of the conductor 110 having elasticity.

Consequently, the formed area of the solder 130 increases in size not only at the long side 115a of the conductor 110 having elasticity but also at the short side 115b thereof such that the bonding strength between the conductor 110 having elasticity and the functional element 120 may further increase. Therefore, the reliability of the product may be further improved.

Meanwhile, the conductor 110 having elasticity may include a contact portion 111, a bent portion 112, a separated portion 113, the exterior portion 114, and the terminal 115 (see FIG. 1).

Here, the conductor 110 having elasticity may be a C-clip which is substantially "C"-shaped. Since the conductor 110 having elasticity comes into line contact or into point contact, galvanic corrosion may be suppressed or minimized.

The contact portion 111 may be formed to have a curved portion in the form of a clip and come into electrical contact with the conductor of the electronic device. The contact portion 111 may be disposed in an opening 114b provided at one side of an upper surface 114a of the exterior portion 114 to allow the curved portion to protrude outward from the opening 114b.

The bent portion 112 may be formed to extend from the contact portion 111 in a round shape and may have an elastic force. That is, the bent portion 112 may be formed to have a predetermined curvature so as to provide an elastic force. Here, one end of the bent portion 112 may be connected to the contact portion 111 inside the conductor 110 having elasticity, and the other end thereof may be connected to the upper surface 114a between the exterior portions 114.

The separated portion 113 is a space formed between side walls 114c of the exterior portion 114 below the bent portion 112. Thus, the bent portion 112 may be spaced a predetermined distance from the terminal 115. That is, the separated portion 113 separates the bent portion 112 from the terminal 115 so as to not confine the bent portion 112 providing an elastic force. Consequently, elastic forces due to the contact portion 111 and the bent portion 112 may not be affected by the terminal 115.

The exterior portion 114 includes the upper surface 114a, the opening 114b, and the side wall 114c.

The upper surface 114a is connected to the bent portion 112 and the side wall 114c, and the contact portion 111 is disposed in the opening 114b from an interior thereof to the outside. The opening 114b forms a space in which the contact portion 111 is moved according to the elastic force of the bent portion 112.

The side wall 114c is formed to extend perpendicularly from the terminal 115 at the long side 115a. The side wall 114c may be formed to extend to the short side 115b at which the bent portion 112 is not formed.

As a result, the exterior portion 114 may be made in the form of a case surrounding the contact portion 111 and an end portion of the bent portion 112 from the outside so as to not expose the contact portion 111 and the end portion of the bent portion 112 to the outside.

Consequently, the conductor 110 having elasticity may suppress influence of external factors, such as a hook operated by an operator and the like.

The terminal 115 may correspond to the lower surface of the conductor 110 having elasticity and may be formed to be connected to a lower side of the exterior portion 114. The terminal 115 may be a terminal that comes into contact with the first electrode 121 of the functional element 120 to be electrically connected to the functional element 120.

The contact portion 111, the bent portion 112, the exterior portion 114, and the terminal 115 may be integrally formed of a conductive material having an elastic force.

Meanwhile, the functional element 120 may have a function of protecting a user or an internal circuit. For example, the functional element 120 may include at least one among an electric shock protection element, a varistor, a suppressor, a diode, and a capacitor.

That is, the functional element 120 may block a leakage current of an external power source flowing into the conductor of the electronic device from a ground of the circuit substrate. In this case, the functional element 120 may be configured to have a breakdown voltage Vbr or a withstanding voltage that is higher than a rated voltage of the external power source of the electronic device. Here, the rated voltage may be a standard rated voltage for each country. For example, the rated voltage may be any one among 240 V, 110 V, 220 V, 120 V, and 100 V.

Further, when the conductive case has a function of an antenna, the first electrode 121 and the second electrode 122 provided on the upper surface and the lower surface of the functional element 120, respectively, may serve as a capacitor to block the leakage current of the external power source as well as to pass a communication signal flowed from the conductor of the electronic device or the circuit substrate.

Further, the functional element 120 may have an electrostatic discharge (ESD) function which passes static electricity flowing from the conductive case through the functional element 120 without a dielectric breakdown. In this case, the functional element 120 may be configured to have a breakdown voltage Vbr that is lower than a dielectric breakdown voltage Vcp of a sintered material provided between the first electrode 121 and the second electrode 122.

Accordingly, the functional contactor 100 may electrically connect the conductive case to the circuit substrate to allow a communication signal, static electricity (ESD), and the like to be passed, but the functional contactor 100 may block the leakage current of the external power source from the circuit substrate from flowing to the conductive case.

Meanwhile, in a functional contactor 200 according to a second embodiment of the present invention, an upper surface of a functional element 220 may be provided to have a size that is substantially equal to that of the lower surface of the conductor 110 having elasticity. Hereinafter, the functional contactor 200 will be described with reference to FIGS. 5 to 8. Descriptions of portions which are the same as those of the functional contactor 100 according to the first embodiment described with reference to FIGS. 1 to 4 will be omitted.

Figure 5:
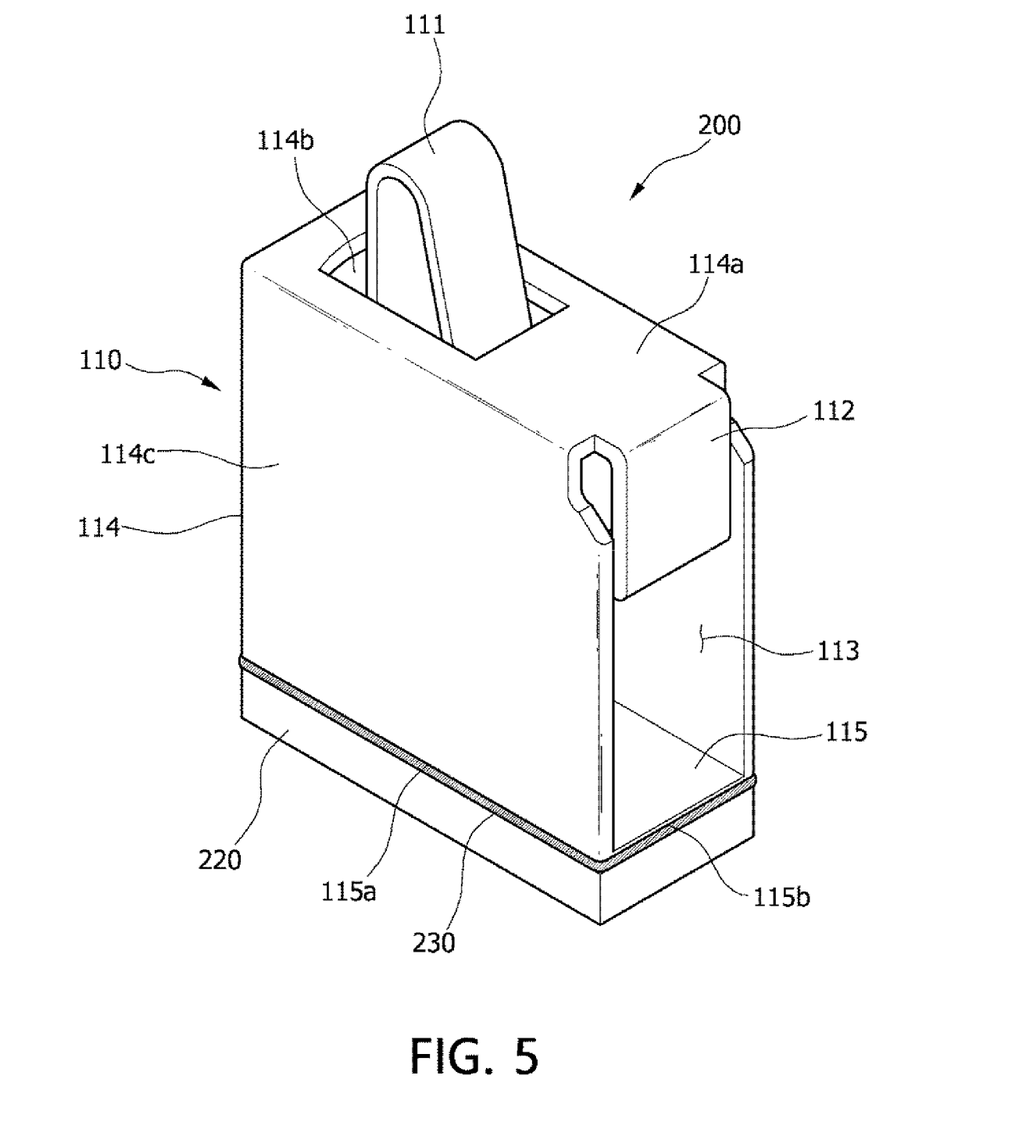
FIG. 5 is a perspective view illustrating a functional contactor according to a second embodiment of the present invention.
Figure 6:
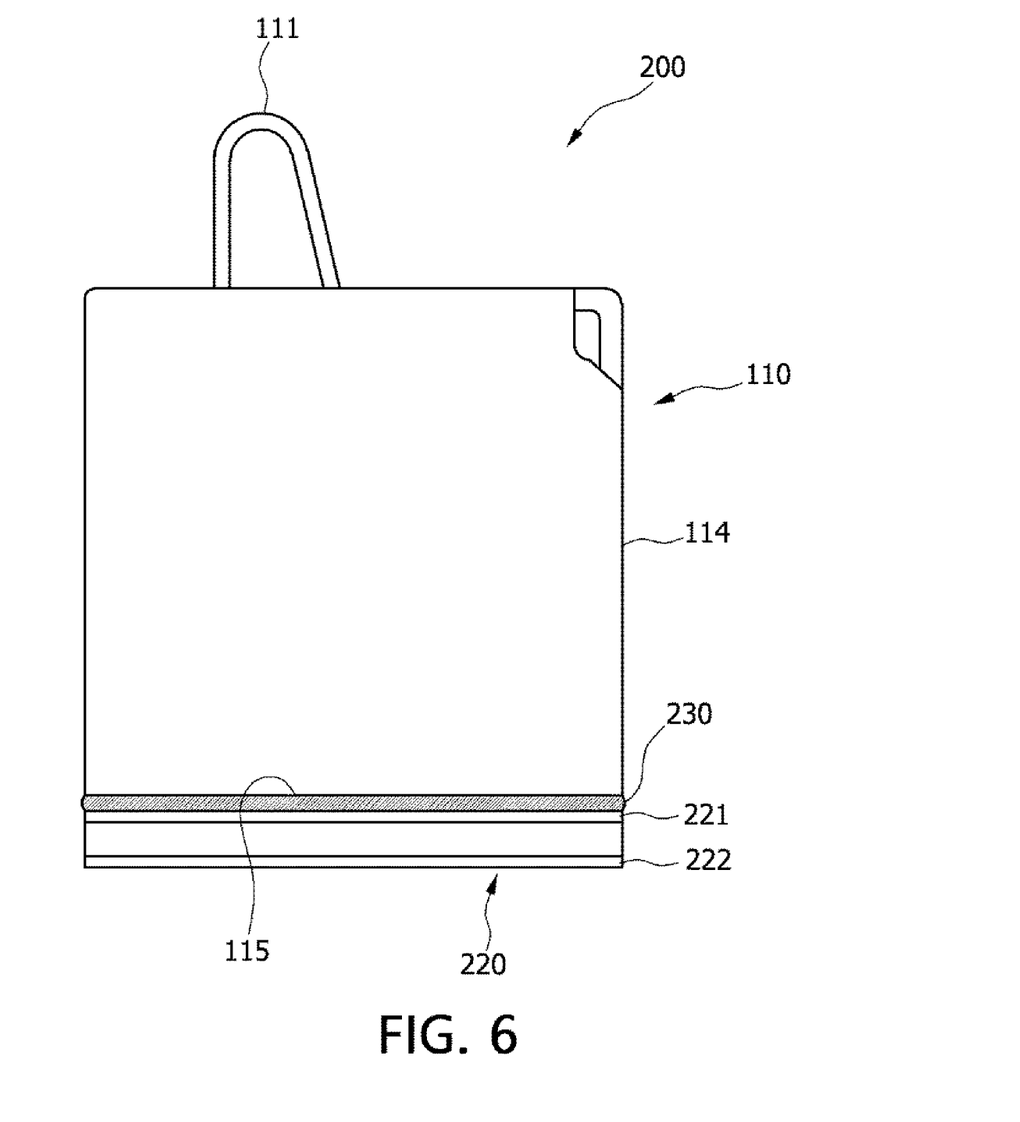
FIG. 6 is a side view of FIG. 5.
Figure 7:
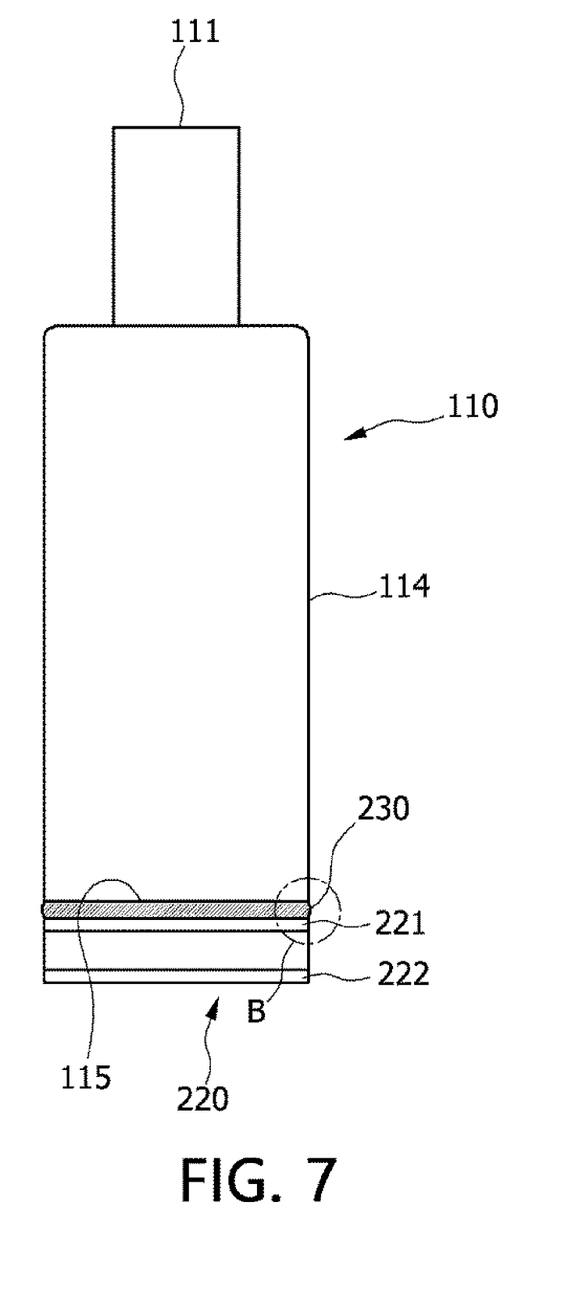
FIG. 7 is a front view of FIG. 5.

As shown in FIGS. 5 to 7, when the conductor 110 having elasticity is bonded to the upper surface of the functional element 220, the functional contactor 200 may be provided to have a bonded surface that is substantially the same as a bonded surface of the conductor 110 so as to prevent occurrence of a portion protruding vertically.

In this case, in the functional contactor 200, a first electrode 221 of the functional element 220 is formed with a predetermined curvature along the long side 115a of the conductor 110 having elasticity. That is, the first electrode 221 of the functional element 220 is formed to have a predetermined curvature at a corner portion of the upper surface of the functional element 220 corresponding to the long side 115a of the conductor 110 having elasticity. The first electrode 221 includes a first portion 221a formed with a predetermined curvature in a region corresponding to the corner portion along the upper surface of the functional element 220 (see FIG. 8).

Figure 8:
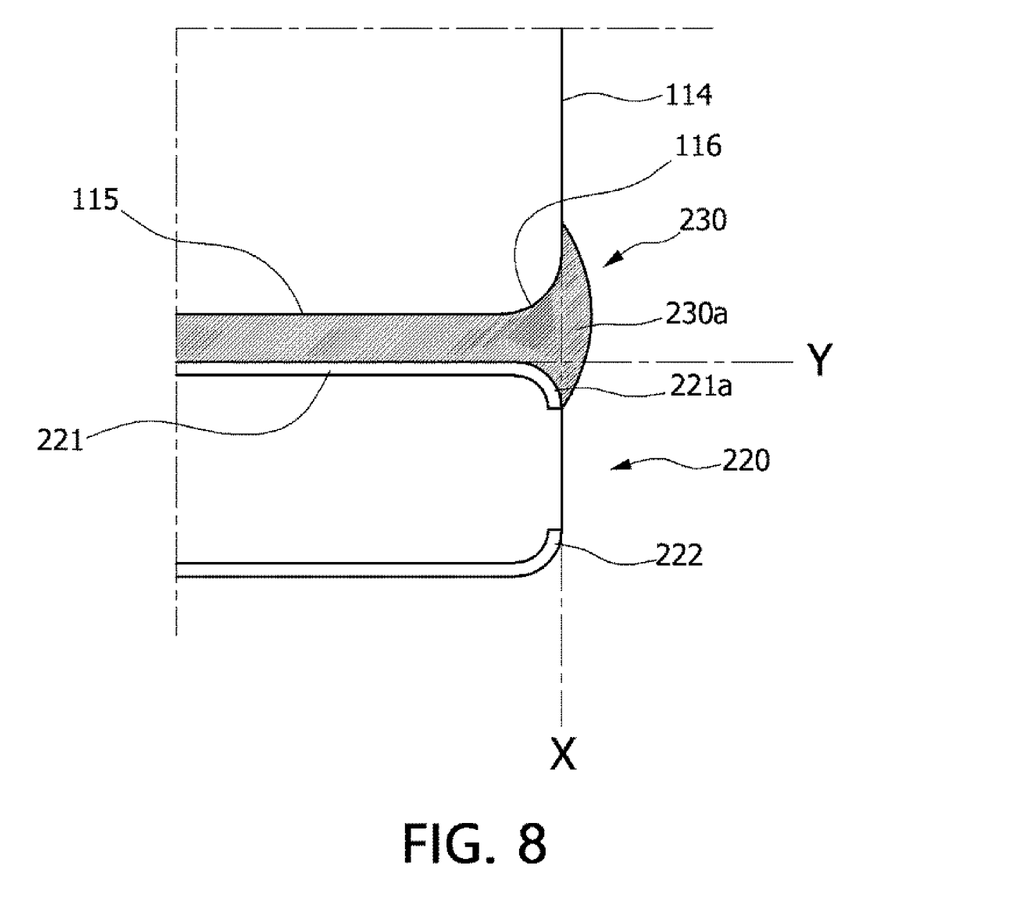
FIG. 8 is an enlarged view of a portion B of FIG. 7.

Here, the first portion 221a corresponds to a corner of the lower surface of the conductor 110 having elasticity. That is, an area of the upper surface of the functional element 220 may be formed to be substantially equal to an area of the lower surface of the conductor 110 having elasticity.

For example, the functional element 220 may be formed to correspond to a vertical line X extending from the side wall 114 of the conductor 110 having elasticity. Here, a longitudinal end of the first portion 221a may be disposed on the vertical line X with respect to a corner of the lower surface of the conductor 110 having elasticity.

Consequently, since the functional element 220 barely has a portion protruding outward from the conductor 110 having elasticity in a horizontal direction, influence on a bonded portion between the conductor 110 having elasticity and the functional element 220 due to external impact in the vertical direction of the functional contactor 200 may be minimized such that bonding strength in the vertical direction may be enhanced.

In this case, a solder 230 is formed between the first portion 221a and a portion of a side surface of the long side 115a of the conductor 110 having elasticity. That is, the solder 230 is mainly disposed between the conductor 110 having elasticity and the functional element 220. During soldering, the molten solder rises along the side surface of the conductor 110 having elasticity while flowing to the first portion 221a of the first electrode 221, thereby forming an exposed portion 230a which is exposed to the outside (see FIG. 8).

Accordingly, the formed area of the solder 230 connecting the conductor 110 having elasticity and the functional element 220 may increase in size due to the exposed portion 230a formed between the first portion 221a of the first electrode 221 and a portion of the side surface of the elastic conductor 110 having elasticity.

Further, when the solder paste applied between the elastic conductor 110 having elasticity and the functional element 220 is fused to flow to the first portion 221a of the first electrode 221 and, simultaneously, to rise along the side surface of the elastic conductor 110 having elasticity, the solder paste is formed in a convex shape such that the solder 230 may be formed to have a predetermined thickness from the bonded portion between the conductor 110 having elasticity and the functional element 220.

Consequently, in the functional contactor 200, the bonding strength between the elastic conductor 110 having elasticity and the functional element 220 may increase with respect to the long side 115a of the elastic conductor 110 such that, even when external impact is applied to the long side 115a, the conductor 110 having elasticity is prevented from being separated from the functional element 220. Consequently, reliability of a product may be improved.

In this case, a plating process may be performed on the portion of the side surface of the conductor 110 having elasticity so as to allow the molten solder to easily rise along the side surface of the elastic conductor 110.

That is, when the plating process is performed with a metal on the lower surface of the conductor 110 having elasticity so as to be easily soldered to the functional element 220, the plating process may be simultaneously performed on the portion of the side surface of the conductor 110 having elasticity. Here, the metal plated on the lower surface and the portion of the side surface of the conductor 110 having elasticity may be Sn.

Consequently, not only does the area of the solder 230 increase, but also the solder 230 is formed to have a predetermined thickness from the bonded portion between the conductor 110 having elasticity and the functional element 220 such that the bonding strength between the conductor 110 having elasticity and the functional element 220 may further be improved at the long side 115a.

In this case, a longitudinal end of the first portion 221a may be formed with a curvature to be disposable at a position spaced a predetermined distance from an upper surface Y of the first electrode 221. Here, the predetermined distance may be a distance whereby the molten solder may stay on a curved surface due to surface tension.

When the first portion 221a is formed with a curvature which is too small and thus the longitudinal end of the first portion 221a is located too close to the upper surface Y of the first electrode 221, an area bonded due to the exposed portion 130a of the solder 230 is not sufficiently secured such that bonding strength sufficient to withstand external impact is not satisfied.

Further, when the first portion 221a is formed with a curvature which is too large and thus the longitudinal end of the first portion 221a is located at a position which is too far from the upper surface Y of the first electrode 221, the molten solder flows downward along the side surface of the functional element 220 during soldering such that the solder 230 may not be located at a desired position, or an amount of the solder 230 being fused may be insufficient.

The first electrode 221 including the first portion 221a may be formed by polishing the functional element 220 with a predetermined curvature through ball mill machining and then plating an entirety of the upper surface Y of the first electrode 221 including the first portion 221a with an electrode material.

Here, like the first electrode 221, a longitudinal end of a second electrode 222 may be formed with a predetermined curvature. This is to improve processability by applying the same process to the upper and lower surfaces of the functional element 220, but the present invention is not limited thereto, and the second electrode 222 may be formed in a flat plate shape without a predetermined curvature.

Further, the conductor 110 having elasticity may further include the round portion 116 between the exterior portion 114 and the terminal 115. That is, the conductor 110 having elasticity may extend due to the round portion 116 having a predetermined curvature between the exterior portion 114 and the terminal 115 (see FIG. 8).

In this case, a curvature of the first portion 221a may be formed to be greater than that of the round portion 116. Here, when the curvature of the first portion 221a is formed to be smaller than that of the round portion 116, since external impact applied to the first portion 221a is greater than that applied to the round portion 116, even though the conductor 110 having elasticity is not separated from the functional element 220, the first electrode 221 is delaminated from a body of the functional element 220.

Consequently, since a corner portion of the conductor 110 having elasticity is formed inward, not only may the solder 230 corresponding to an area of the round portion 116 be further provided between the conductor 110 having elasticity and the functional element 220 but also the solder 230 is formed in symmetrical wedge shape between the conductor 110 having elasticity and the functional element 220 such that the bonding strength between the conductor 110 having elasticity and the functional element 220 may be further enhanced.

Meanwhile, a functional contactor 300 according to a third embodiment of the present invention may include a conductor which has elasticity and in which a separated portion is omitted. Hereinafter, the functional contactor 300 will be described with reference to FIGS. 9 and 10. Descriptions of portions which are the same as those of the functional contactor 100 or 200 described with reference to FIGS. 1 to 8 will be omitted.

Figure 9:
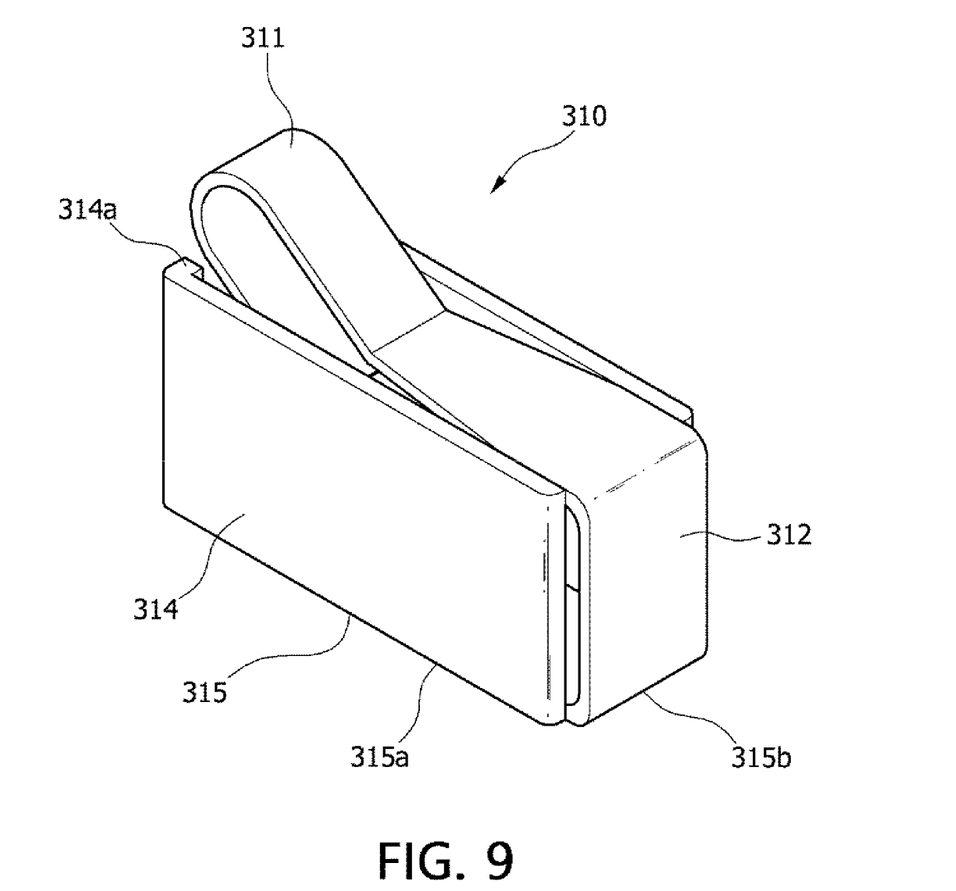
FIG. 9 is a perspective view illustrating an alternative example of a conductor having elasticity in a functional contactor according to an embodiment of the present invention.

As shown in FIG. 9, a conductor 310 having elasticity includes a contact portion 311, a bent portion 312, a side wall 314, and a terminal 315.

Here, the conductor 310 having elasticity may be a C-clip which is substantially "C"-shaped. Since the conductor 310 having elasticity comes into line contact or into point contact with a conductor, galvanic corrosion may be suppressed or minimized.

The contact portion 311 may have a curved portion in the form of a clip and come into electrical contact with the conductor of the electronic device. The contact portion 311 may be disposed to protrude outward between the side walls 314.

The bent portion 312 may be formed to extend from the contact portion 311 in a round shape and may have an elastic force. That is, the bent portion 312 may be formed to have a predetermined curvature so as to provide an elastic force. Here, the bent portion 312 may be formed to extend from the terminal 3115. That is, the bent portion 312 may be disposed between the contact portion 311 and the terminal 315.

The side wall 314 is formed to extend perpendicularly from the terminal 315 at a long side 315a. The side wall may extend to a portion 314a of a short side 315b at which the bent portion 312 is not formed. That is, portions 314a are formed on two sides of side walls 314 at the short side 315b at which the bent portion 312 is not formed, thereby forming a space between the portions 314a. In this case, the contact portion 311 may be moved due to an elastic force of the bent portion 312 in the space between the portions 314a of the side walls 314.

Consequently, the conductor 310 having elasticity may suppress influence of external factors, such as a hook operated by an operator and the like.

The terminal 315 may correspond to a lower surface of the conductor 310 having elasticity and may be formed to be connected to a lower side of the side wall 314. The terminal 315 may be a terminal that comes into contact with the first electrode 321 of the functional element 320 to be electrically connected to the functional element 320.

The contact portion 311, the bent portion 312, the side wall 314, and the terminal 315 may be integrally formed of a conductive material having an elastic force.

Figure 10:
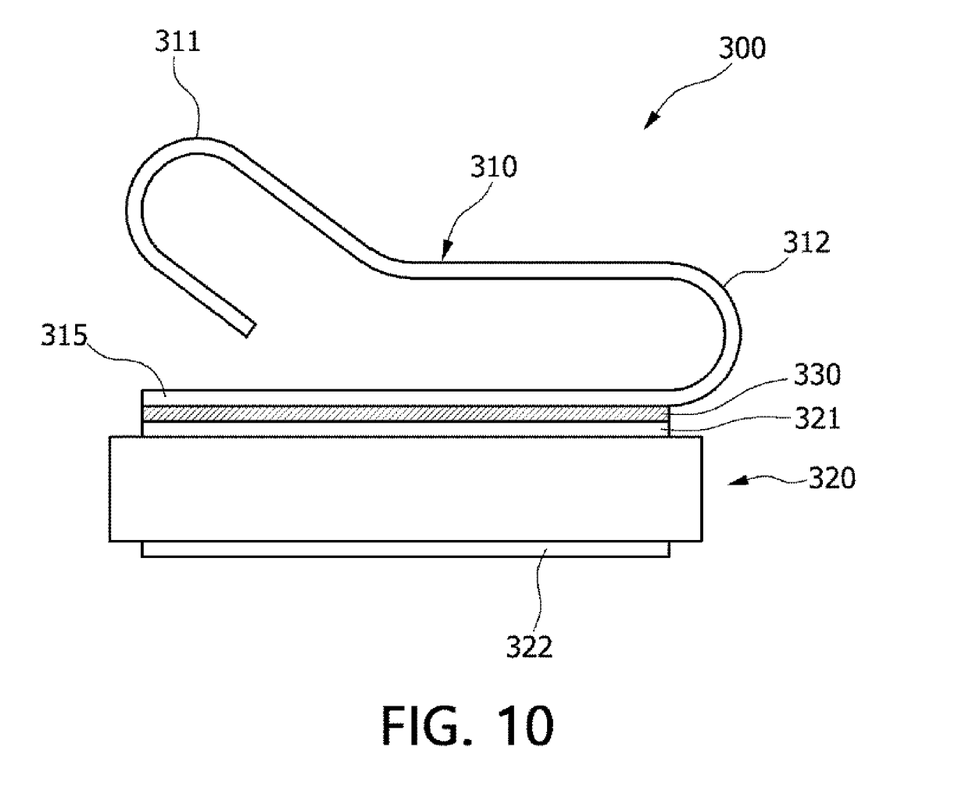
FIG. 10 is a cross-sectional view of the functional contactor to which the conductor having elasticity of FIG. 9 is applied.

The functional contactor 300 may further include a functional element 320.

The functional element 320 is electrically connected in series to the conductor 310 having elasticity, and a first electrode 321 and a second electrode 322 are provided on at least a part of an upper surface and at least a part of a lower surface of the functional element 320, respectively.

In this case, since the bent portion 312 of the conductor 310 having elasticity is formed to extend from the terminal 315, the first electrode 321 of the functional element 320 is not formed at a position corresponding to the bent portion 312 so as to not confine the bent portion 312 providing an elastic force.

That is, the first electrode 321 may be formed on only a portion of the upper surface of the functional element 320 (see FIG. 10). In this case, the second electrode 322 may also be formed only on a portion of the lower surface to correspond to the first electrode 321. Accordingly, in the functional element 320, a body formed between the first electrode 321 and the second electrode 322 may be formed to protrude outward from the first electrode 321 and the second electrode 322.

Here, although not shown in the drawings, as shown in FIG. 4 or 8, a portion bonded to the functional element 320, i.e., the first electrode 321, may be formed to extend outward from the conductor 310 having elasticity below the side wall 314 at the long side 315a of the conductor 310.

Consequently, bonding strength between the functional element 320 and the conductor 310 having elasticity may be enhanced with respect to external impact on the side wall 314 constituting the long side 315a.

Although the exemplary embodiments of the present invention have been described, the spirit of the present invention is not limited to the exemplary embodiments disclosed herein, and it should be understood that numerous other embodiments can be devised by those skilled in the art that will fall within the same spirit and scope of this disclosure through addition, modification, deletion, supplement, and the like of a component, and these other embodiments will also fall within the spirit and scope of the present invention.

The invention claimed is:

1. A functional contactor comprising:
a conductor having elasticity and configured to come into contact with a conductor of an electronic device;
a functional element connected to the conductor having elasticity and having a first electrode and a second electrode which are provided on at least a part of an upper surface and at least a part of a lower surface of the functional element, respectively; and
a solder configured to bond a lower surface of the conductor having elasticity and the first electrode of the functional element,
wherein the first electrode comprises a first portion extending outward from the lower surface of the conductor having elasticity along one side of the conductor having elasticity,
wherein the solder comprises an exposed portion formed between the first portion and a side surface of the one side of the conductor having elasticity,
wherein the conductor having elasticity comprises a clip-shaped contact portion configured to come into contact with the conductor of the electronic device, a bent portion formed with a predetermined curvature so as to provide an elastic force, and a terminal configured to be in contact with the first electrode of the functional element, and
wherein the bent portion extends from the terminal.

2. The functional contactor of claim 1, wherein:
the conductor having elasticity comprises a lower surface having a long side and a short side; and
the first portion is formed along the long side.

3. The functional contactor of claim 2, wherein a length of a short side of the first electrode is greater than a length of the short side of the lower surface of the conductor having elasticity.

4. The functional contactor of claim 1, wherein the lower surface and a portion of the side surface of the conductor having elasticity is plated by a metal.

5. The functional contactor of claim 4, wherein the metal comprises Sn.

6. The functional contactor of claim 1, wherein the first electrode comprises a second portion extending outward from the lower surface of the conductor having elasticity along the other side of the conductor having elasticity.

7. The functional contactor of claim 1, wherein the first electrode and the second electrode are provided on an entirety of the upper surface and an entirety of the lower surface of the functional element, respectively.

8. The functional contactor of claim 1, wherein the conductor having elasticity further comprises a side wall extending perpendicularly from the one side of the conductor.

9. The functional contactor of claim 8, wherein the side wall extends to at least a part of the other side at which the bent portion is not formed.

10. The functional contactor of claim 8, wherein a portion between the side wall and the terminal extends with a predetermined curvature.

11. The functional contactor of claim 1, wherein the functional element has at least one function among an electric shock prevention function of blocking a leakage current of an external power source flowing from a ground of a circuit substrate of the electronic device, a communication signal transfer function of passing a communication signal flowed from a conductive case or the circuit substrate, and an electrostatic discharge (ESD) protection function of discharging and passing static electricity when the static electricity flows from the conductive case.

12. A functional contactor comprising:
a conductor having elasticity and configured to come into contact with a conductor of an electronic device;
a functional element connected to the conductor having elasticity and having a first electrode and a second electrode which are provided on at least a part of an upper surface and at least a part of a lower surface of the functional element, respectively; and
a solder configured to bond a lower surface of the conductor having elasticity and the first electrode of the functional element,
wherein the first electrode comprises a first portion formed with a predetermined curvature along one side of the conductor having elasticity,
a longitudinal end of the first portion corresponds to a corner of a lower surface of the conductor having elasticity, and
the solder comprises an exposed portion formed between the first portion and a side surface of the one side of the conductor having elasticity.

13. The functional contactor of claim 12, wherein:
the conductor having elasticity comprises a lower surface having a long side and a short side; and
the first portion is formed along the long side.

14. The functional contactor of claim 12, wherein the longitudinal end of the first portion is disposed on a line perpendicular to the corner of the lower surface of the conductor having elasticity.

15. A functional contactor comprising:
a conductor having elasticity and configured to come into contact with a conductor of an electronic device;
a functional element connected to the conductor having elasticity and having a first electrode and a second electrode which are provided on at least a part of an upper surface and at least a part of a lower surface of the functional element, respectively; and
a solder configured to bond a lower surface of the conductor having elasticity and the first electrode of the functional element,
wherein the first electrode comprises a first portion extending outward from the lower surface of the conductor having elasticity along one side of the conductor having elasticity,
wherein the solder comprises an exposed portion formed between the first portion and a side surface of the one side of the conductor having elasticity,
wherein the conductor having elasticity comprises a clip-shaped contact portion configured to come into contact with the conductor of the electronic device, a bent portion formed with a predetermined curvature so as to provide an elastic force, a terminal configured to be in contact with the first electrode of the functional element, and a side wall extending perpendicularly from the one side of the conductor, and
wherein the side wall extends to at least a part of the other side at which the bent portion is not formed.

16. A functional contactor comprising:
a conductor having elasticity and configured to come into contact with a conductor of an electronic device;
a functional element connected to the conductor having elasticity and having a first electrode and a second electrode which are provided on at least a part of an upper surface and at least a part of a lower surface of the functional element, respectively; and
a solder configured to bond a lower surface of the conductor having elasticity and the first electrode of the functional element,
wherein the first electrode comprises a first portion extending outward from the lower surface of the conductor having elasticity along one side of the conductor having elasticity,
wherein the solder comprises an exposed portion formed between the first portion and a side surface of the one side of the conductor having elasticity,
wherein the conductor having elasticity comprises a clip-shaped contact portion configured to come into contact with the conductor of the electronic device, a bent portion formed with a predetermined curvature so as to provide an elastic force, a terminal configured to be in contact with the first electrode of the functional element, and a side wall extending perpendicularly from the one side of the conductor, and
wherein a portion between the side wall and the terminal extends with a predetermined curvature.

17. A functional contactor comprising:
a conductor having elasticity and configured to come into contact with a conductor of an electronic device;
a functional element connected to the conductor having elasticity and having a first electrode and a second electrode which are provided on at least a part of an upper surface and at least a part of a lower surface of the functional element, respectively; and
a solder configured to bond a lower surface of the conductor having elasticity and the first electrode of the functional element, wherein the first electrode comprises a first portion extending outward from the lower surface of the conductor having elasticity along one side of the conductor having elasticity, wherein the solder comprises an exposed portion formed between the first portion and a side surface of the one side of the conductor having elasticity, wherein the conductor having elasticity comprises a clip-shaped contact portion configured to come into contact with the conductor of the electronic device, a bent portion formed with a predetermined curvature so as to provide an elastic force, and a terminal configured to be in contact with the first electrode of the functional element, and wherein the bent portion is spaced a predetermined distance from the terminal.

* * * * *